United States Patent [19]
Bass, Jr. et al.

[11] Patent Number: 6,086,627
[45] Date of Patent: Jul. 11, 2000

[54] METHOD OF AUTOMATED ESD PROTECTION LEVEL VERIFICATION

[75] Inventors: Roy S. Bass, Jr., Essex Junction; Daniel J. Nickel, Westford; Daniel C. Sullivan, Hinesburg; Steven H. Voldman, South Burlington, all of Vt.

[73] Assignee: International Business Machines Corporation, Armonk, N.Y.

[21] Appl. No.: 09/015,825

[22] Filed: Jan. 29, 1998

[51] Int. Cl.$^7$ ................................................ G06F 17/50
[52] U.S. Cl. ................................................... 716/5
[58] Field of Search ................... 395/500.05, 500.06, 395/500.09, 500.11; 716/4, 5, 8, 10

[56] References Cited

U.S. PATENT DOCUMENTS

| | | | |
|---|---|---|---|
| 4,988,636 | 1/1991 | Masleid et al. | 437/51 |
| 5,519,633 | 5/1996 | Chang et al. | 364/491 |
| 5,547,887 | 8/1996 | Brown et al. | 437/51 |
| 5,648,910 | 7/1997 | Ito | 364/490 |
| 5,689,432 | 11/1997 | Blaauw et al. | 364/490 |
| 5,796,638 | 8/1998 | Kang et al. | 395/500.06 |

OTHER PUBLICATIONS

A. G. George, et al., "Packaging Alternatives to Large Silicon Chips: Tiled Silicon on MCM and PWB Substrates", IEEE, 1996, pp. 699–708.
M. Ker, et al., "Whole–Chip ESD Protection Design for Submicron CMOS VLSI", IEEE, Jun. 1997, pp. 1920–1923.
P. Zuchowski, et al., "I/O Impedance Matching Algorithms for High–Performance ASICs", ASIC 1997 Conference, no pg #s.
B. Basaran, et al., "Latchup–Aware Placement and Parasitic–Bounded Routing of Custom Analog Cells", IEEE, 1993, pp. 415–421.
J. Easton, et al., "A System Engineering Approach to Design of On–Clip Electrostatic Discharge Protection", IEEE, 1996, pp. 22–28.
B. Rodgers, et al., "Attacking ESD", Circuits Assembly, Jun. 1995, p. 40.
S. Beebe, "Methodology for Layout Design and Organization of ESD Protection Transistors", EOS/ESD Symposium, 1996, pp. 265–275.
W. Russell, "Defuse the Threat of ED Damage", Electronic Design, Mar. 6, 1995, p. 115.
C. Duvury et al., "ESD: A Pervasive Reliability Concern for IC Technologies", Proceedings of the IEEE, vol. 81, No. 5, May 1993, pp. 690–702.
Jim Lipman, "Postlayout EDS Tools Lock Onto Full–Chip Verification", EDN, Oct. 10, 1996, pp. ,93–104.

*Primary Examiner*—Paul R. Lintz
*Assistant Examiner*—Leigh Marie Garbowski
*Attorney, Agent, or Firm*—Whitham, Curtis & Whitham; Richard M. Kotulak, Esq.

[57] ABSTRACT

A integrated circuit (IC) chip with ESD protection level and the system and method of wiring the IC chip. Minimum wire width and maximum resistance constraints are applied to each of the chip's I/O ports. These constraints are propagated to the design and array pads are wired to I/O cells located on the chip. Thus, wiring is such that wires and vias to ESD protect devices are wide enough to provide adequate ESD protection level. The design is then verified by first identifying the chip pads, I/O cells and ESD protect devices. Connections between these three structures are verified. Wires between the ESD protect devices and the chip pads and I/O cells are shrunk such that unsuitable connections becomes opens (disconnected) and are found in subsequent checking. Finally connections to guard rings are checked. Power rails are checked in a similar manner.

4 Claims, 8 Drawing Sheets

METHOD OF AUTOMATED ESD PROTECTION LEVEL VERIFICATION

DESCRIPTION

RELATED APPLICATION

The present invention is related to U.S. patent application Ser. No. 09/015,819 entitled "Method of Automated Design and Checking for ESD Robustness" to Huber et al., filed coincident herewith and assigned to the assignee of the present application.

BACKGROUND OF THE INVENTION

1. Field of the Invention

The present invention generally relates to methods of integrated circuit checking and verification and more particularly to methods of integrated circuit wiring checking and verification.

2. Background Description

Advances in integrated circuit (IC) chip wiring technology have improved circuit performance and density, simultaneously with reducing IC chip cost. Both circuit density and the number of wireable circuits on an IC chip have been increased through wire feature scaling to reduce metal line pitch and contact pitch, in combination with increasing the number of available wiring layers.

The increase in the number of circuits on a single chip has led to a corresponding increase in the number of chip connection pads for chip inputs/outputs (I/Os) and for supplying power and ground to the chip. Consequently, to take full advantage of this increased IC chip gate count and complexity and to provide more locations for chip pad connections, standard chip images such as chip image 100 in FIG. 1 cannot be used.

Standard chip images 100 have well defined circumferentially located I/O cells 102 and predefined power busses. These prior art standard chip images 100 included circumferentially located electrostatic discharge (ESD) protection devices (not shown) connected to the circuit in the I/O cell 102 and an external connection pad 104. Each ESD device is meant to absorb the charge in the ESD event and, thereby, protect the I/O circuit from static electricity damage.

Typically, prior art ESD devices were designed and located based on well understood requirements of the particular circuit, cell and the physical characteristics of the ESD protect device. Thus, for a single power supply chip, the ESD device may have been, merely, a pair of reverse biased diodes, each connected between a supply or its return line (ground) and the I/O pad 104.

However, on a multiple supply chip, besides providing a ground discharge path, paths must be provided between each pad 104 and each power supply. Also, protect devices are typically required between supply pads 104. Thus, for a 2-supply chip, even an I/O cell 102 with a circuit connected to only to a single supply would require an ESD path between the connecting pad and the unused (by that I/O circuit) supply. This requirement makes wiring an already complex chip even more difficult.

The added level of complexity for prior art standard image 100 chips was minimal. The I/O circuit to pad 104 connections are pre-defined and fixed on a standard image 100, so the electrical characteristics of the connections are guaranteed.

These electrical characteristics are determined by type of wiring metal (aluminum or copper, etc.), as well as wire and via (inter metal-metal layer connections) dimensions, i.e., widths, lengths, thicknesses and contact sizes. Thus, by design, each individual I/O cell may have a fixed, well defined internal resistance associated with it, thereby assuring that the ratio of fixed wire resistance to internal cell resistance.

Further, multiple supply standard images 100 are designed with larger circumferential power busses that increases supply capacitance, which further reduces supply ESD sensitivity. So, because the power bussing is well defined, the requisite inter-supply ESD protect devices may be hid in unoccupied spaces among the I/O cells 102 of the circumferential I/O footprint. Additionally, regardless of which of the power supply lines any particular I/O circuit actually uses, all supply lines are routed to ESD protect devices for the I/O cell 102. Consequently, the I/O cells 102 can be checked, readily, to verify that ESD protect devices are includes, guaranteeing their inclusion where necessary and, in a predetermined ratio with the signal I/O cells.

However, with the increased I/O count requirement on state of the art IC chips, I/O cell placement is not restricted to the chip's periphery, the normal location for ESD devices. Instead, with an area array footprint, wires connecting I/O circuits to the I/O pads are routed either automatically by a design system or, interactively by a designer. Power busses are not as well defined and do not provided the extra protection from the added capacitance found on prior art standard images 100.

However, the net wires must still meet pre-determined electrical constraints determined by each included wiring layer's thickness and metallurgy in combination with the particular net's wire widths, which may vary from net to net. So, to guarantee ESD protection level, the interconnection routing must meets some minimum wire width constraint on each wiring layer and some minimum via size and number.

Thus, there is a need for integrated circuit chips with pad array interconnections having robust ESD protection.

SUMMARY OF THE INVENTION

It is therefore a purpose of the present invention to improve integrated circuit chip ESD protection.

It is another purpose of the present invention to allow free form I/O cell placement on integrated circuit chip without impairing chip ESD protection.

It is yet another purpose of the present invention to verify ESD protection on integrated chips.

It is yet another purpose of the invention to verify ESD protection on power lines on integrated chips.

It is yet another purpose of the invention to verify wire and via interconnect ESD protection level between chip pads and an ESD network.

It is yet another purpose of the invention to verify wire and via interconnect ESD protection level between power rails and an ESD network.

It is yet another purpose of the invention to verify ESD protection on power rails, ground rails and between power and ground rails.

The present invention is a integrated circuit (IC) chip with ESD protection level and the system and method of checking the IC chip. A chip design is wired and, then, verified, first identifying the chip pads, I/O cells and ESD protect devices. Connections between these three structures are verified. Wires between the ESD protect devices and the chip pads and I/O cells are shrunk such that unsuitable connections becomes opens (disconnected) and are found in subsequent checking. Finally connections to guard rings are checked. Power rails are checked in a similar manner.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
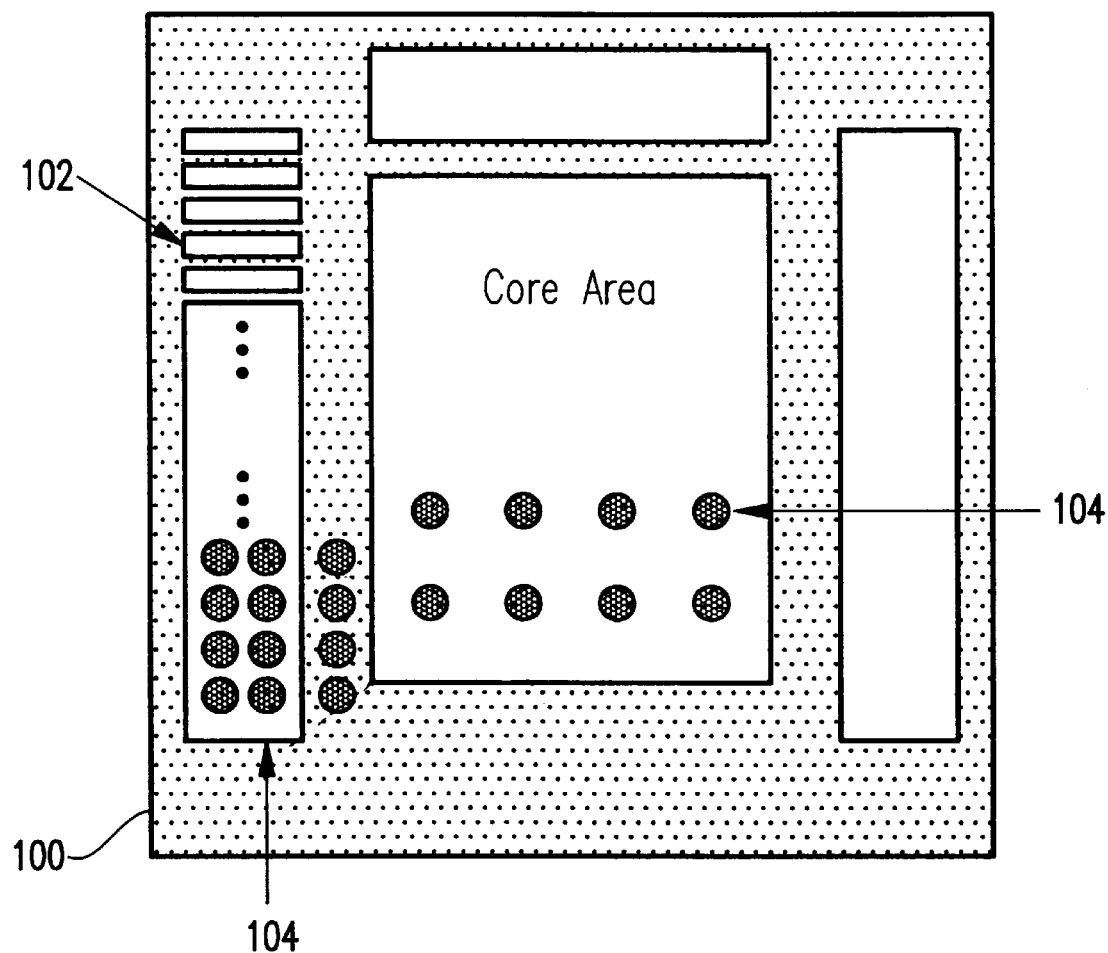
FIG. 1 shows a prior art standard image footprint.
Figure 2:
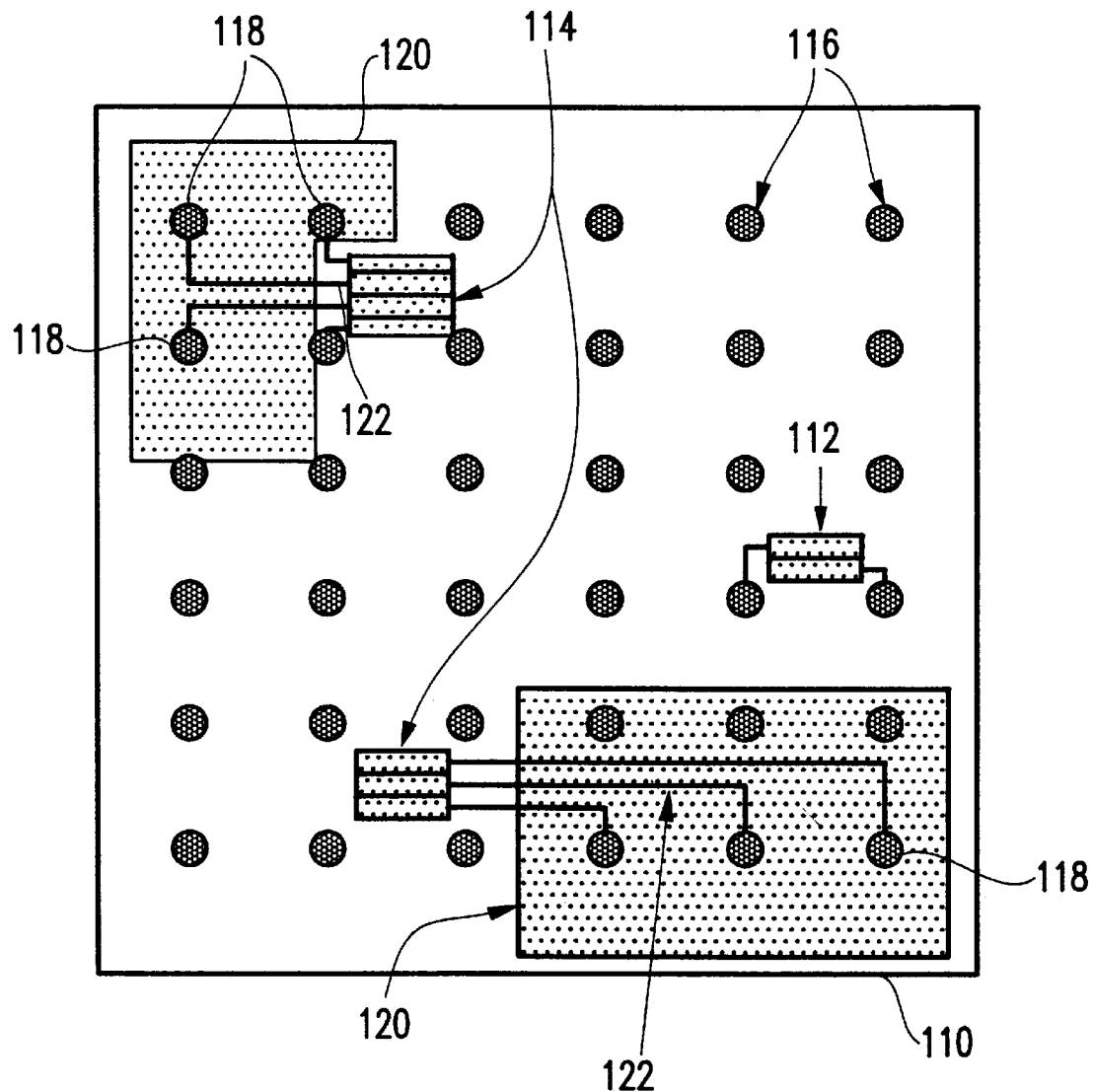
FIG. 2 shows an example of a chip 110 upon which may be checked according to the preferred embodiment method.
Figure 4:
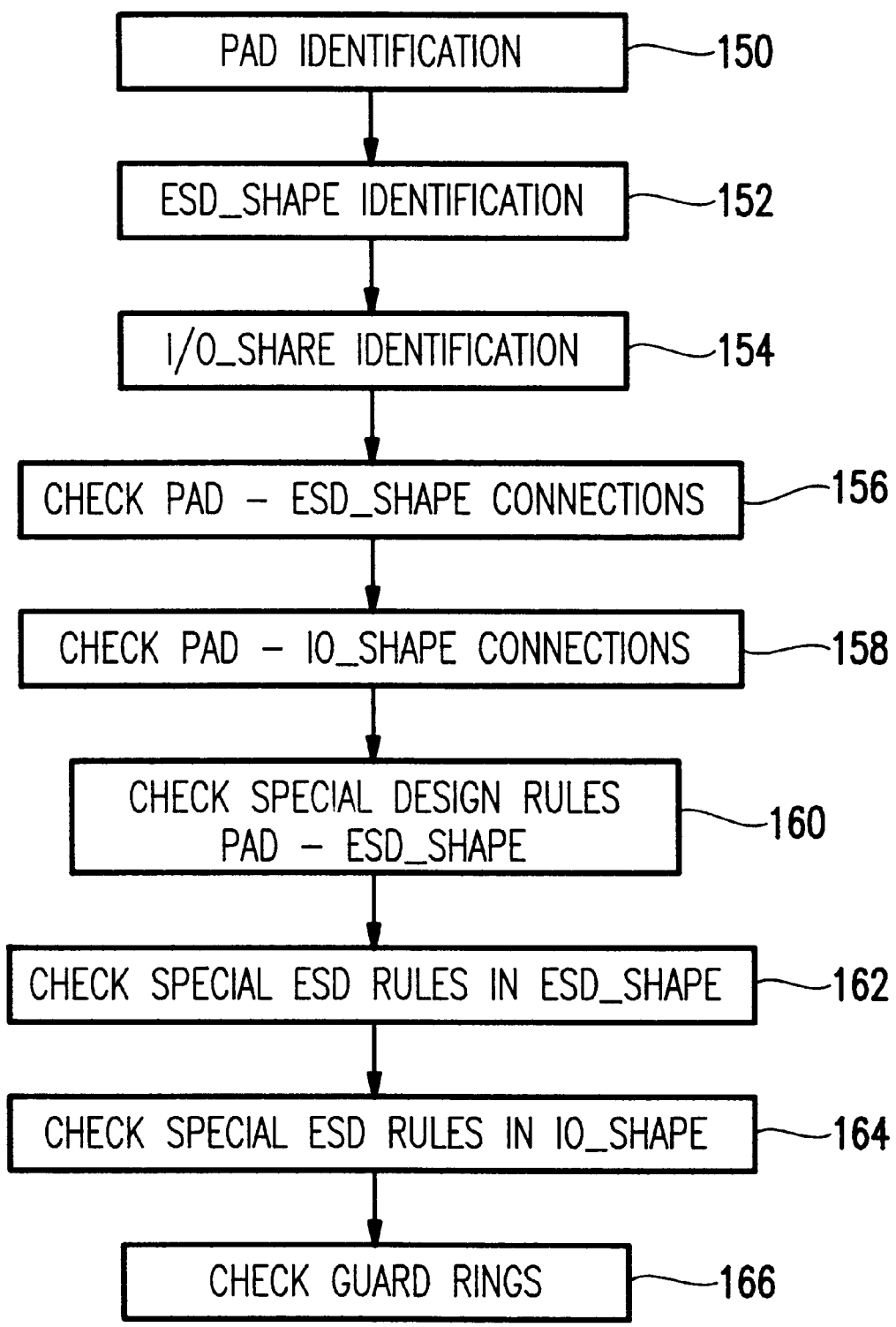
FIG. 4 shows a flow diagram of the preferred embodiment design audit method.

Referring now to the drawings, and more particularly to FIG. 2, which shows an example of a chip 110 upon which may be checked according to the preferred embodiment method of FIG. 4.

Thus, as can be seen in chip 110 in FIG. 2, I/O circuits in cells 112, 114 located throughout the chip are connected to pads 116, 118. Pads 118 are located over core circuit areas 120. Nets 122 between I/O circuits in cells 114 and pads 118.

Figure 3:
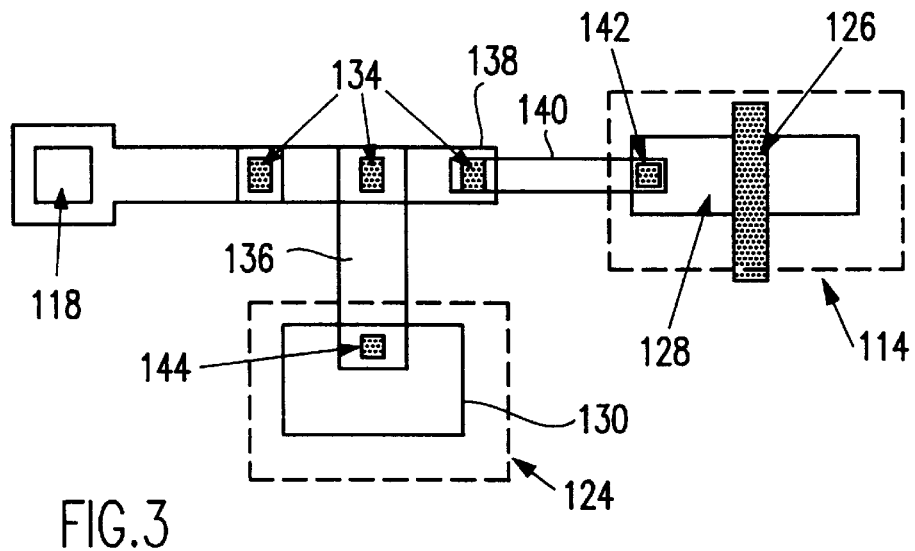
FIG. 3 is a detailed example of a typical net being checked according to the preferred embodiment method including an I/O cell, an ESD cell and pad.

FIG. 3 is a detailed example of a typical net being checked, including I/O cell 114, an ESD cell 124 and pad 118. For simplicity, in this example, the circuit in the I/O cell is represented by a single polysilicon gate 126 intersecting thin oxide area 128 and the protect device in the ESD cell 124 is represented by thin oxide area 130. Pad 118, which is at the surface of the chip 110, is part of or, connected to metal shape 132. Vias 134 connect metal wires 136, 138 and 140 to metal shape 132, forming the I/O wiring net. Contacts 142, 144 connect the wiring net to I/O cell 114 and 124, respectively. The preferred embodiment final audit of FIG. 4 verifies that metal wires 132, 138 and 140 are wider that the minimum width and that the resistance from vias 134 does not exceed the maximum tolerable resistance.

First, in the preferred embodiment final audit of FIG. 4, in step 150, I/O pads 116, 118 are identified and tagged as a PAD. In step 152, all protect devices are identified and tagged with an ESD_SHAPE, as represented by rectangle 124 in FIG. 3. Then, in step 154 all I/O cells 112, 114 are identified and tagged with an IO_SHAPE.

Next, in step 156 each PAD 116, 118 is checked for a connection to an ESD_SHAPE. Then, in step 158 each PAD 116, 118 is checked for a connection to an IO_SHAPE.

Biases are applied to net wires and vias to shrink them such that any wires and vias below the constraint appear as opens. Then, in step 160 wire width and resistance between each PAD and its associated ESD_SHAPE are checked and any failures (opens) are recorded. In step 162, each ESD protection device is checked for ESD protection level within ESD_SHAPE. ESD protection level is verified; First, by checking physical spaces between design levels; Next, by evaluating power to failure based structure area, perimeter or cross-sections; and, then, evaluating critical current to failures based on models and physical design dimensions. For example, ESD diode failure level can be determined by comparing the diode area to a power-to-failure/unit area.

In step 164, each I/O circuit and it pertinent connections are checked for ESD protection level within IO_SHAPE and any failures recorded. Finally, in step 166 individual protect devices and I/O cells are checked for inclusion of appropriate guard rings.

Figure 5:
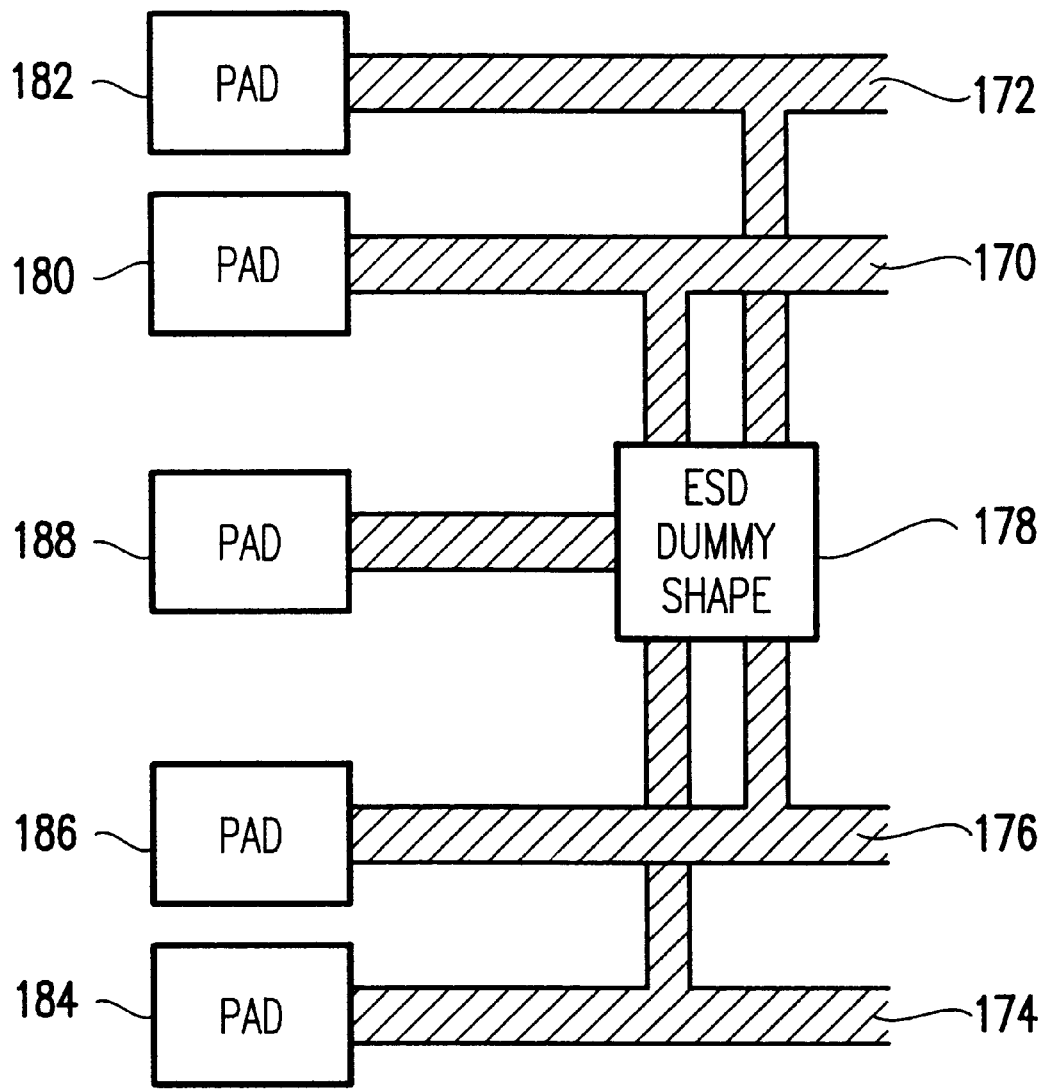
FIG. 5 shows supply and return lines passing through an ESD_SHAPE.
Figure 8:
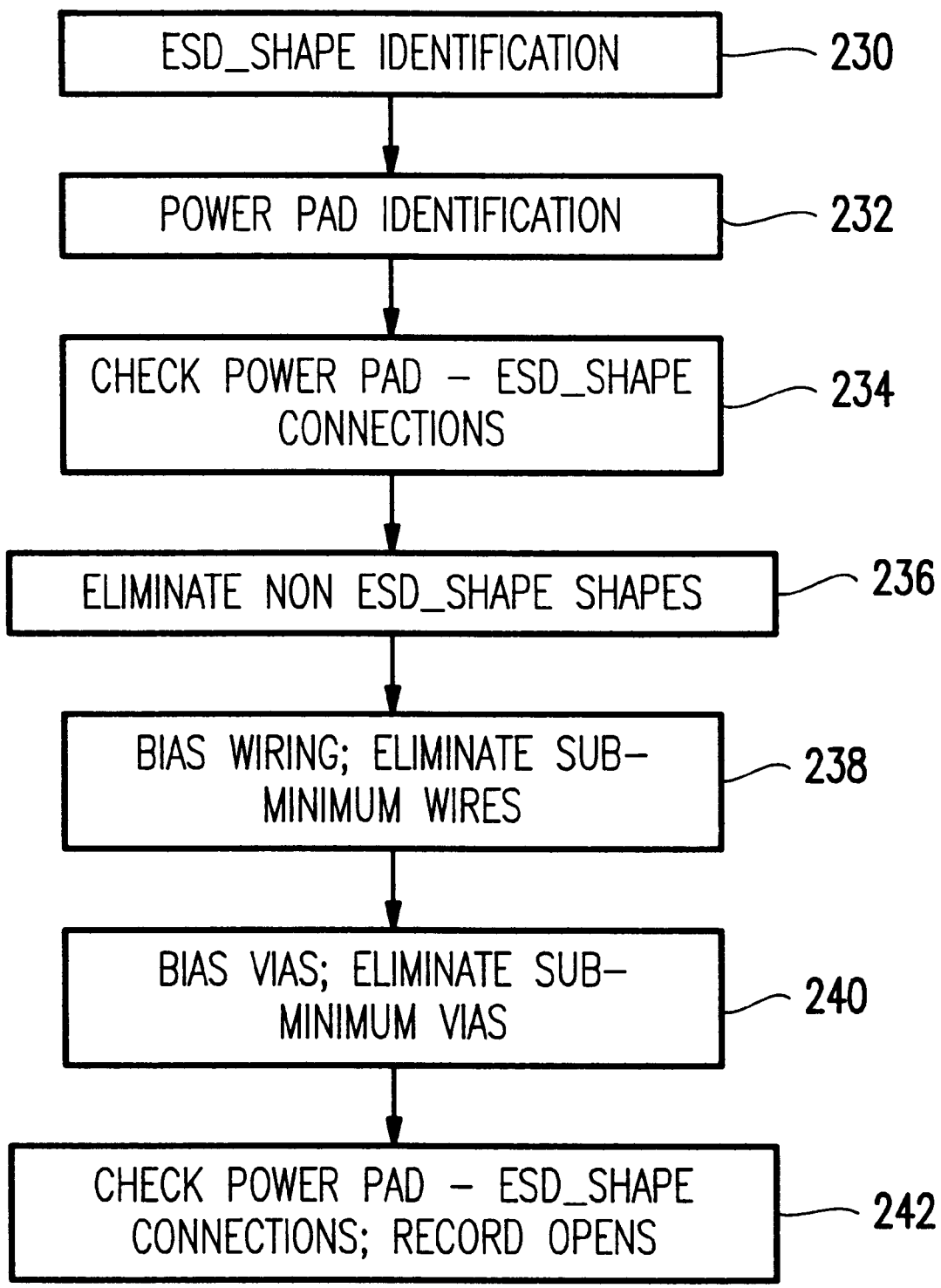
FIG. 8 a flow diagram of checking protect devices on power supply lines and ground or return lines.
Figure 9:
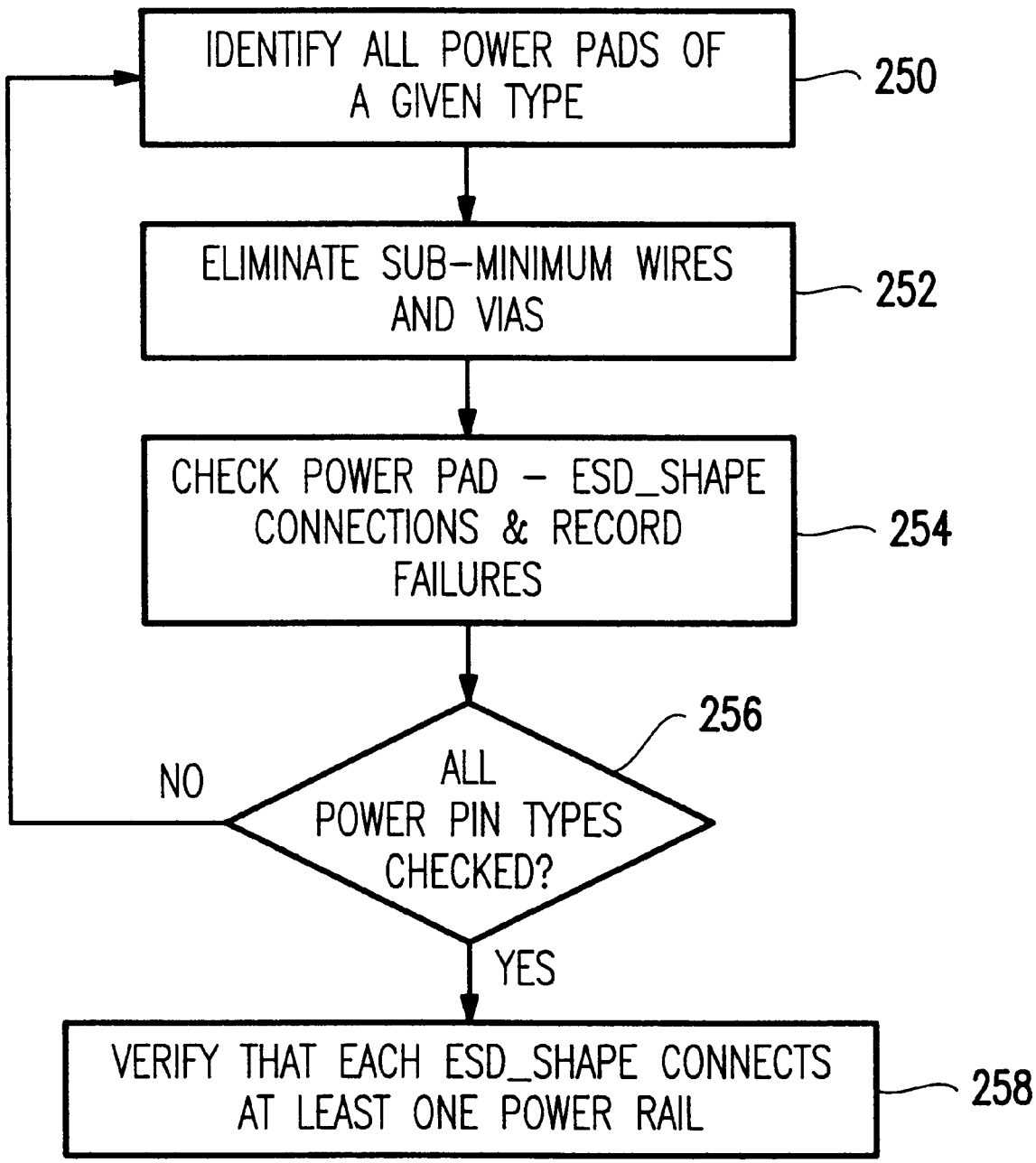
FIG. 9 is an alternate method of checking protect devices on the power supply lines and ground or return lines.

The protect devices on the power supply lines (170, 172 in FIG. 5) and ground or return lines 174, 176 are checked in a similar manner to that of the checking method of FIG. 4 as represented in FIGS. 8 and 9. FIG. 5 shows supply lines 170, 172 and return lines 174, 176 passing through an ESD_SHAPE 178. Supply lines 170, 172 are connected to pads 180, 182, return lines 174, 176 are connected to pads 184, 186 and ESD_SHAPE 178 is connected to pad 188.

Figure 6:
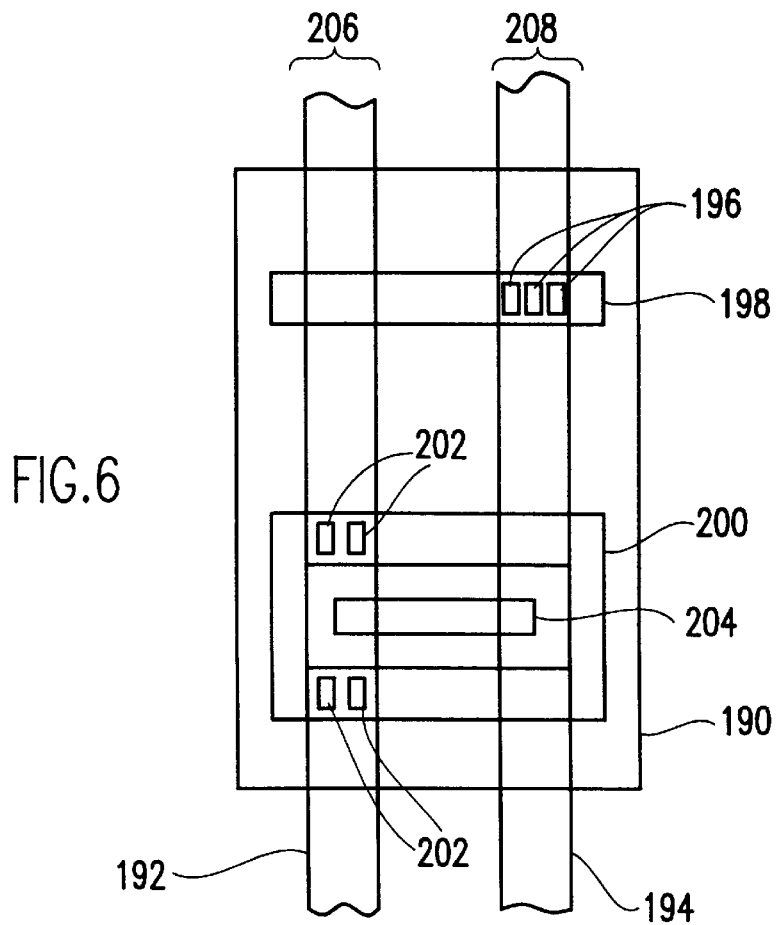
FIG. 6 shows a protect device intersected by a power line and a ground line.
Figure 7:
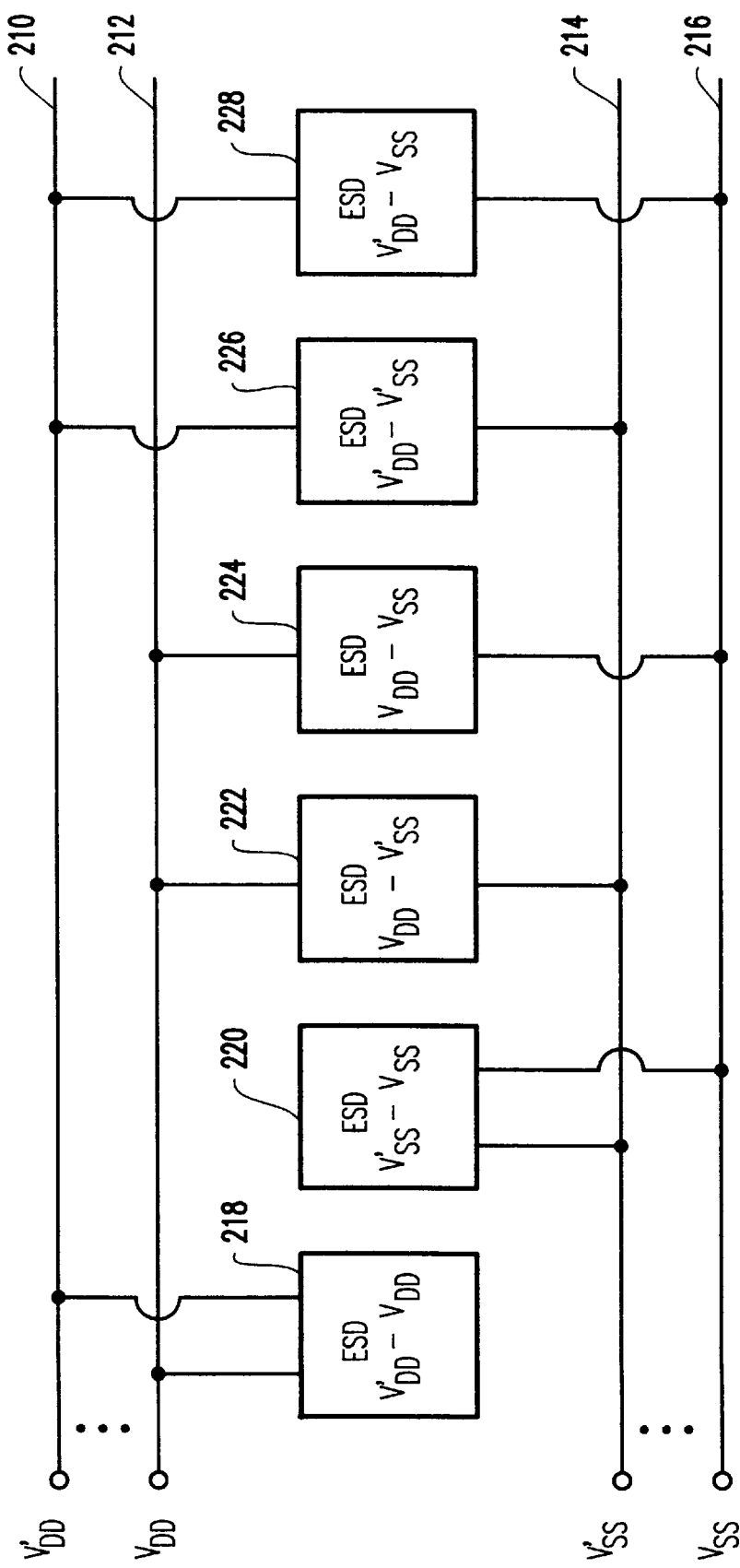
FIG. 7 shows ESD protection on a multiple supply/return IC chip.

FIG. 6 is an example of a protect device 190 intersected by power line 192 and ground line 194 in ESD shape 178, checked according to the flow diagram of FIG. 8. Ground line 194 is connected to the protect device 190 through contacts 196 to diffusion 198. The power supply line 192 contacts an n-type diffusion 200 through contacts 202. Connection is made to the protect device 190 from I/O pad 188 through p-type diffusion 204. The checking program first identifies connections between supply lines 192 and ground lines 194 and, then checks their respective widths 206, 208, FIG. 7 shows ESD protection network for a multiple supply lines 210 and 212 and multiple return lines 214 and 216 on an IC chip. The network includes an ESD protect device 218 between supply lines 210, 212 and protect device 220 between return lines 214, 216. In addition protect devices 222, 224, 226 and 228 are included between individual ones of supply lines 210, 212 and return lines 214, 216. Accordingly if supply lines in addition to lines 210, 212 are included, additional protect devices between individual supply lines would also be included, as well as including additional protect devices between the additional supply lines and return lines 214, 216. Likewise, if return lines in addition to lines 214, 216 are included corresponding additional protect devices would be included.

So, in checking the power bussing structure of FIGS. 5–7, first, in step 230 in FIG. 8, all protect devices are identified and tagged with an ESD_SHAPE. All I/O cell (sometimes referred to as external or peripheral) power and ground rails are identified and tagged with an appropriate shape, e.g., VDD1, VSS1, etc. In step 232, all supply pads are identified and tagged with VDD and, all ground pads are identified and tagged with VSS. In step 234 all wires connected to a previously identified and tagged shape are identified and, in step 236 any remaining unidentified wires are deleted to reduce data volume.

In step 238, biases are applied to remaining wires and vias, in step 240, to shrink them such that any wires and vias below the constraint dimensions appear as opens. Individual pads may be connect to a protect device through multiple parallel lines. In this case, the bias applied in step 238 is applied to an effective cross section of the sum of the wires, instead of to each wire individually. Likewise, vias are typically uniform in shape regardless of connection and multiple vias are provided between two interconnecting lines to reduce the effective resistance of the connection. As with multiple parallel lines, the bias is applies in step 240 to the effective cross-sectional area of the multiple vias.

After biasing the lines and vias, in step 242 each power/ground pad is checked for connection to a protect device and any failures (opens) are recorded. As a final check the wire cross-sections and the number of interlevel vias may be counted between each power/ground pad and its associated protect device.

FIG. 9 is an alternate embodiment method of checking protect devices on the power supply lines and ground or return lines. In step 250, all power pads of a particular type are identified. In step 252 biases are applied to remaining wires and vias to shrink them such that any wires and vias below the constraint appear as opens. Then, in step 254 power pads are checked to verify connection to protect devices and any opens are recorded as errors. Steps 250–254 are repeated in step 256 until all power and ground pads have been checked. Finally, in step 258 each ESD shape is checked to verify that it is connected to at least one power supply line and at least one return or ground line.

Thus, having identified any failures, whether due to an omitted protect device, connection to a protect device or a constraint violation, the wiring may be altered to correct the violation.

While the invention has been described in terms of preferred embodiments, those skilled in the art will recognize that the invention can be practiced with modification within the spirit and scope of the appended claims.

We claim:

1. An electrostatic discharge (ESD) verification system for a chip design comprising:

identification means for identifying input output (I/O) pads, power and power return pads, I/O cells and electrostatic discharge (ESD) devices;

means for creating a network including ESD dummy shapes, said ESD dummy shapes representing a shape of said ESD devices, said network comprising wires connecting I/O pads, said power and power return pads, and said I/O cells to said ESD dummy shapes;

verification means for verifying that said wires in said network meets a minimum ESD protection criteria, said verification means further for applying a bias to said wires to remove said wires below a minimum constraint such that said wires appear as opens when checked by verification means indicating that a particular said I/O cell is not connected to one of said electrostatic discharge devices.

2. An electrostatic discharge (ESD) verification system for a chip design as recited in claim 1, further comprising:

means for determining an effective cross section of the sum of said wires which are connected in parallel prior to biasing.

3. A method of checking an integrated circuit chip for electrostatic discharge (ESD) robustness, comprising the steps of:

identifying input/output (I/O) pads on a chip;

identifying ESD protection devices on said chip;

representing said ESD protection devices as a dummy ESD shape;

identifying a network comprising wires and vias connecting said I/O pads to said ESD dummy shape;

determining effective wire cross sections of the sum of any of said wires which are connected in parallel to said ESD dummy shape;

eliminating ones of said vias, said wires, and said wire cross sections below a minimum constraint to create opens;

checking for said opens to determine ones of said I/O pads not connected to said ESD dummy shape; and recording any of said I/O pads not connected to said ESD dummy shape.

4. A method of checking an integrated circuit chip for electrostatic discharge (ESD) robustness as recited in claim 3, wherein said eliminating step comprises:

verifying that said wires and said wire cross sections are wider that the minimum width; and verifying that resistance from said vias does not exceed a maximum tolerable resistance.

* * * * *